United States Patent
Lee et al.

(10) Patent No.: US 7,453,133 B2
(45) Date of Patent: Nov. 18, 2008

(54) SILICIDE/SEMICONDUCTOR STRUCTURE AND METHOD OF FABRICATION

(75) Inventors: Wen-Chin Lee, Hsin-Chu (TW); Chung-Hu Ge, Taipei (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/880,992

(22) Filed: Jun. 30, 2004

(65) Prior Publication Data

US 2005/0045969 A1    Mar. 3, 2005

Related U.S. Application Data

(60) Provisional application No. 60/498,775, filed on Aug. 29, 2003.

(51) Int. Cl.
*H01L 27/095*    (2006.01)

(52) U.S. Cl. ............... 257/486; 257/377; 257/472; 257/476; 257/485; 257/E29.271; 257/E29.311

(58) Field of Classification Search ............ 257/377, 257/471, 472, 476, 485, 486, 916, E29.128, 257/E29.271, E29.311
See application file for complete search history.

(56) References Cited

U.S. PATENT DOCUMENTS

| | | | |
|---|---|---|---|
| 5,336,903 A | | 8/1994 | Ozturk et al. |
| 6,121,100 A | | 9/2000 | Andideh et al. |
| 6,235,568 B1 | | 5/2001 | Murthy et al. |
| 6,319,782 B1 | * | 11/2001 | Nakabayashi ............ 438/300 |
| 6,465,842 B2 | * | 10/2002 | Nishinohara ............ 257/330 |
| 6,509,586 B2 | * | 1/2003 | Awano ............ 257/192 |
| 6,562,716 B2 | * | 5/2003 | Hashimoto et al. ......... 438/664 |
| 6,682,965 B1 | * | 1/2004 | Noguchi et al. ........... 438/199 |
| 6,737,324 B2 | * | 5/2004 | Chang ............ 438/300 |
| 7,045,864 B2 | * | 5/2006 | Funayama et al. ......... 257/369 |
| 2002/0101481 A1 | * | 8/2002 | McClelland et al. ......... 347/56 |
| 2002/0190284 A1 | | 12/2002 | Murthy et al. |
| 2003/0011037 A1 | * | 1/2003 | Chau et al. ............ 257/412 |
| 2003/0020120 A1 | * | 1/2003 | Ye et al. ............ 257/377 |
| 2003/0080361 A1 | | 5/2003 | Murthy et al. |
| 2003/0227029 A1 | * | 12/2003 | Lochtefeld et al. ......... 257/200 |

OTHER PUBLICATIONS

Saito, M., et al., "Advanced Thermally Stable Silicide S/D Electrodes for High-Speed Logic Circuits with Large-Scale Embedded $Ta_2O_5$-Capacitor DRAMs," IEDM, 1999, pp. 805-808.
Öztörk, M.C., et al., "Advanced $Si_{1-x}Ge_x$ Source/Drain and Contact Technologies for Sub-70 nm CMOS," IEEE, 2002.
Liou, H.K., et al., "Interfacial Reactions and Schottky Barriers of Pt and Pd on Epitaxial $Si_{1-x}Ge_x$ Alloys," Appl. Phys. Lett., vol. 60, No. 5, Feb. 3, 1992, pp. 577-579.

* cited by examiner

*Primary Examiner*—Matthew E Warren
(74) *Attorney, Agent, or Firm*—Slater & Matsil, L.L.P.

(57) ABSTRACT

A preferred embodiment of the present invention comprises a dielectric/metal/$2^{nd}$ energy bandgap ($E_g$) semiconductor/$1^{st}$ $E_g$ substrate structure. In order to reduce the contact resistance, a semiconductor with a lower energy bandgap ($2^{nd}$ $E_g$) is put in contact with metal. The energy bandgap of the $2^{nd}$ $E_g$ semiconductor is lower than the energy bandgap of the $1^{st}$ $E_g$ semiconductor and preferably lower than 1.1eV. In addition, a layer of dielectric may be deposited on the metal. The dielectric layer has built-in stress to compensate for the stress in the metal, $2^{nd}$ $E_g$ semiconductor and $1^{st}$ $E_g$ substrate. A process of making the structure is also disclosed.

19 Claims, 3 Drawing Sheets

SILICIDE/SEMICONDUCTOR STRUCTURE AND METHOD OF FABRICATION

This application claims priority to provisional patent application Ser. No. 60/498,775, filed Aug. 29, 2003, entitled "A Silicide/Semiconductor Structure and Method of Fabrication," which application is incorporated herein by reference.

TECHNICAL FIELD

This invention is related generally to semiconductor devices, and more specifically to devices employing low band gap materials.

BACKGROUND

As the size of semiconductor devices in VLSI circuits continues to shrink, the impact of contact resistance in device performance is becoming more important. Generally, when metal is in contact with doped silicon, such as at the contact to a transistor source or drain region or gate electrode, a Schottky barrier is formed at the interface. This Schottky barrier contributes to a higher contact resistance, thus decreasing device performance. Generally, higher contact resistance degrades drive current, which in turn limits device performance and speed, increases device heating, and causes other undesirable consequences.

One approach to lowering contact resistance is to increase the doping concentration of the semiconductor region to which contact is made, typically a transistor source or drain region or gate electrode, although the region could be a doped polysilicon resistor, a capacitor plate, or some other doped region. Traditionally, such regions are formed from a doped silicon region, e.g., a silicon or polysilicon layer that has been doped with impurities such as arsenic, phosphorous, boron, and the like. Generally, increasing the level of the impurity concentration impacts many device characteristics, including decreasing undesirable contact resistance. Silicon has limited impurity solubility, however, so the ability to decrease contact resistance by increasing the dopant concentration cannot proceed beyond the impurity solubility limits of the silicon. The impurity concentration level may have significant impact on other device characteristics as well, and hence the impact on contact resistance cannot be taken in isolation of other ways that the impurity concentration may affect device performance. This may further limit the ability to reduce contact resistance by increasing impurity concentration.

The use of a silicide layer for decreasing the contact resistance is also known. In conventional devices, a metal silicide layer is formed on the doped region to which contact is to be made. This silicide region is typically formed either by depositing a silicide layer (e.g., titanium silicide, tungsten silicide, cobalt silicide) on the silicon or polysilicon region to which contact is to be made (e.g., a source or drain region, a gate region, a doped polysilicon layer), or by converting a portion of the silicon or polysilicon region to a silicide (an in situ process by which a metal film is deposited on the region and wherein the metal and (poly)silicon interact to form a silicide in a subsequent thermal processing step).

As the trend toward smaller device geometries increases, coupled with the desire for still further improved device performance, the need exists for structures and methods that will allow for decreased contact resistance. This is particularly true for devices having gate lengths in the 90 nm and below range.

SUMMARY OF THE INVENTION

A preferred embodiment of the present invention comprises a dielectric/metal/$2^{nd}$ energy bandgap ($E_g$) semiconductor/$1^{st}$ $E_g$ substrate structure. In order to reduce the contact resistance, a semiconductor with a lower energy bandgap ($2^{nd}$ $E_g$) is put in contact with metal. The energy bandgap of the $2^{nd}$ $E_g$ semiconductor is lower than the energy bandgap of the $1^{st}$ $E_g$ semiconductor and preferably lower than 1.1 eV. In addition, a layer of dielectric may be deposited on the metal. The dielectric layer has built-in stress to compensate for the stress in the metal, $2^{nd}$ $E_g$ semiconductor and $1^{st}$ $E_g$ substrate. A process of making the structure is also disclosed.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
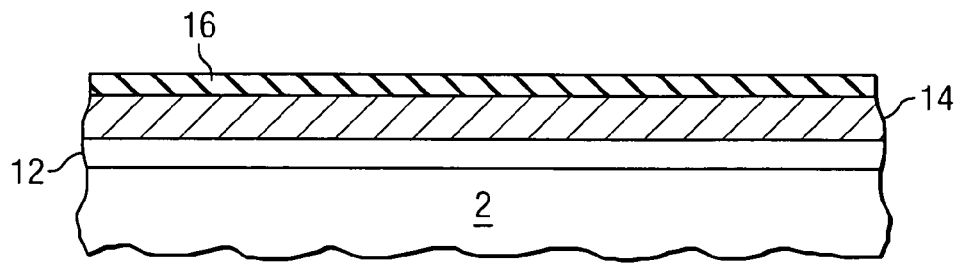
FIG. 1 is a cross-sectional view of a dielectric/metal/second bandgap semiconductor material/first bandgap semiconductor material structure.

An integrated circuit structure with low contact resistance is described wherein a second semiconductor material with lower energy bandgap is disposed between a contact metal and a substrate. Reducing the energy bandgap of the semiconductor may reduce the Schottky barrier. FIG. 1 illustrates the cross-sectional view of a dielectric/metal/second energy bandgap semiconductor material/first energy bandgap semiconductor material structure. FIGS. 2a through 2g illustrate processing steps in forming a CMOS device that employs the structure shown in FIG. 1. Throughout the drawings, like reference numerals will be used to indicate the same or corresponding features.

In FIG. 1, substrate 2 is preferably a semiconductor or insulator. More preferably, substrate 2 is formed of silicon, either a bulk silicon wafer or a layer of silicon formed on an insulating layer such as a buried oxide layer (BOX), in the well-known silicon-on-insulator (SOI) structure. In other embodiments, substrate 2 may be formed of other semiconductor or insulator materials such as silicon dioxide, oxynitride, nitride or high-k dielectrics. Semiconductor material 12 is preferably a semiconductor material having a bandgap energy that is lower than the bandgap energy of the underlying silicon layer 2. In preferred embodiments, the second bandgap energy layer 12 is epitaxially grown on substrate 2. Preferably, layer 12 has a bandgap energy of less than 1.1 eV, which is below the bandgap energy of 1.12 eV for silicon substrate 2. Semiconductor 12 generally lowers the Schottky barrier formed at the metal to semiconductor interface. As discussed above, the lower bandgap energy generally lowers contact resistance.

In some embodiments, a crystal lattice mismatch between substrate 2 and semiconductor layer 12 may cause stress (either compressive or tensile depending upon the materials chosen and the method of deposition) to develop at the interface between the materials. This stress may also propagate throughout layer 12, potentially degrading device performance and reliability. As will be discussed in further detail below, this stress may be compensated for in subsequently applied layers.

Also illustrated in FIG. 1 is metal 14 deposited on semiconductor layer 12. Preferably, metal 14 is a metal compound or alloy of transition metals. As described in more detail below, metal 14 may be a silicide formed on the surface of semiconductor layer 12. Since metal 14 is in direct contact with semiconductor layer 12, at equilibrium the carriers flow a short distance across the interface causing a build up of charges on both sides of the interface, thereby forming a Schottky barrier. The height of the barrier is approximately determined by the bandgap of the semiconductor, in addition to other factors. Semiconductor layer 12 is selected to have a bandgap energy below that of the substrate 2 so that the Schottky barrier height between metal 14 and semiconductor 12 will be smaller than the barrier height between a directly contacting metal 14 and substrate 2 interface.

Dielectric layer 16 is deposited on metal 14. The thickness is preferably between 50 Å-1000 Å, and more preferably about 200-600 Å. Generally, dielectric layer 16 may serve three primary purposes. First, dielectric layer 16 compensates for the stress arising from the lattice mismatch between semiconductor layer 12 and metal 14 and between semiconductor layer 12 and substrate 2. By relieving the stress caused by lattice mismatch, the number of defects in the metal 14, semiconductor layer 12 and substrate 2 can be reduced, thus improving device reliability and performance. As will be described in greater detail below, dielectric layer 16 can be deposited to have significant stress properties, perhaps higher than 400 MPa in order to compensate for significant stress in the underlying layers.

Second, dielectric layer 16 preferably acts as an etch stop layer and provides a margin of error for over-etching of subsequently formed layers, such as a subsequently formed interlevel dielectric (ILD) layer. Generally, as device geometries shrink, the thickness of silicide layer 14 also shrinks. For instance, an exemplary MOS device having a gate geometry of 0.13 microns might have a silicide layer (metal layer 14) of only 300-400 Å in thickness. For 90 nm, 65 nm, and smaller geometry devices, the silicide layer generally will be concomitantly thinner, which significantly increases the risk that the silicide layer will be etched away when the contact window is opened in a subsequently formed ILD. While etch end-point detection technology provides for a high degree of accuracy, there is very little margin of error with silicide regions as thin as described herein. Dielectric layer 16 provides for an additional margin of error by acting as an etch stop for the overlying ILD. With dielectric layer 16 positioned between ILD 18 (FIG. 2f) and the silicide layer, etching may be performed in two steps. First, etching ILD layer 18 and stopping at dielectric layer 16. Since ILD layer 18 is much thicker than dielectric layer 16, it is difficult to etch through ILD layer 18 and stop precisely at dielectric layer 16. Overetching into dielectric layer 16 should not be a big concern as long as layer 16 is not completely etched through. Second, etching dielectric layer 16 and stopping at silicide layer 14. Dielectric layer 16 (200-600 Å) is significantly thinner than ILD layer 18, so it is much easier to etch through it and stop at a thin layer of silicide than to etch through a thick layer of ILD 18 (typically >3000 Å) and stop at the thin silicide layer 14.

Third, dielectric layer 16 helps stabilize the underlying silicide by inhibiting contamination during downstream process steps. Such contamination may come from the oxidation of the silicide layer during the deposition of ILD layer 18. Further details are provided in "Advanced Thermally Stable Silicide S/D Electrodes for High-Speed Logic Circuits with Large-Scale Embedded $Ta_2O_5$-Capacitor DRAMS," by M. Saito, et al., IEDM 99-805, which is hereby incorporated herein by reference.

FIGS. 2a through 2g illustrate one embodiment of the present invention wherein the structure illustrated in FIG. 1 is integrated into the process of forming a MOS transistor. One skilled in the art will recognize that the teachings herein could apply to a wide range of devices, including NMOS and PMOS transistors, CMOS devices, doped polysilicon resistors, integrated capacitors and inductors, and contact regions to bulk silicon. Other applications of the teachings contained herein will become apparent with routine experimentation. In the illustrated embodiment, the dielectric/metal/second bandgap energy semiconductor/first bandgap energy substrate structure is used in source and drain regions to lower contact resistance. The structure may also be used in the gate electrode region as well.

Figure 2A:
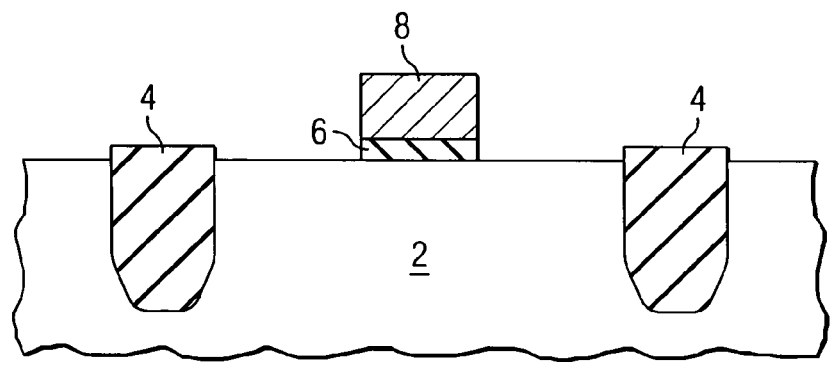
FIGS. 2a through 2g are cross-sectional views of intermediate stages in the manufacture of a MOS transistor embodiment.

FIG. 2a illustrates a substrate 2 with Shallow Trench Isolation (STI) regions 4. The STI regions are preferably formed by etching shallow trenches in substrate 2, and filling the trenches with an insulator such as silicon oxide. As is well known, STI regions isolate the active regions in which transistors and the like will be formed. Substrate 2 can be either a bulk semiconductor wafer or an SOI configuration. In other embodiments, substrate 2 may be strained-Si on relaxed SiGe; it may also comprise Si, Ge, C, a compound semiconductor or combinations thereof.

Gate dielectric 6 and gate electrode 8 are also illustrated in FIG. 2a. As is known in the art, a gate dielectric layer is first formed on substrate 2, followed by a gate electrode layer. These layers are then patterned and etched to form the gate electrode 8 and gate dielectric layer 6. Gate dielectric layer 6 may comprise $SiO_2$, oxynitride, nitride and high-k materials. Gate electrode 8 is preferably polysilicon, although it may be formed of metal or a compound structure of dielectric/metal/semiconductor. This compound structure plus the gate dielectric may be formed from the structure disclosed in FIG. 1.

Figure 2B:
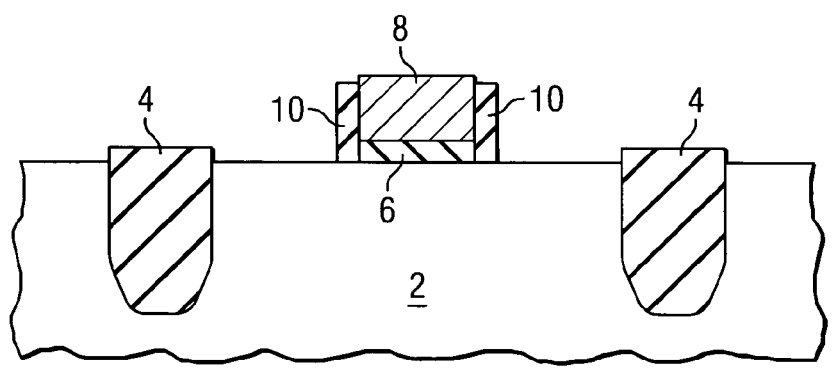

FIG. 2b illustrates a pair of spacers 10 formed along the sidewalls of the gate dielectric 6 and gate electrode 8. Spacers 10 serve as self-aligning masks for subsequent source/drain formation steps, as described below. The spacers may be formed by well-known methods such as blanket depositing a dielectric layer over the entire region including substrate 2 and gate electrode 8, then anisotropically etching to remove the dielectric from the horizontal surfaces and leaving spacers 10. Doping of the regions of substrate 2 on either side of gate dielectric 6 or spacers 10 may be performed to form part or all of the transistor source and drain regions.

Figure 2C:
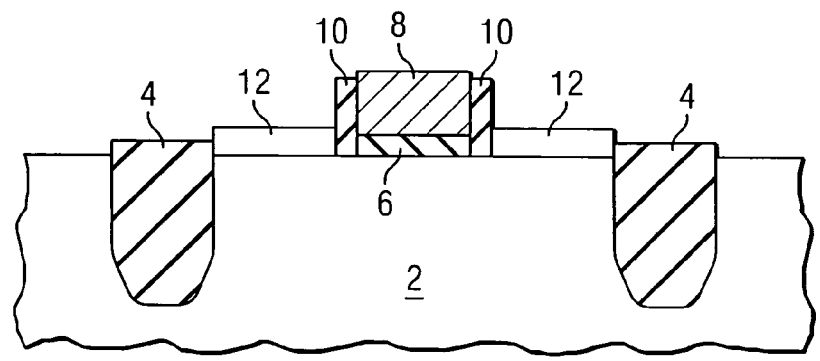

As shown in FIG. 2c, a semiconductor material 12, which may be used as part or all of the transistor source and drain regions, is epitaxially deposited to a thickness of 400 Å-600 Å. A preferred method of forming semiconductor material 12 is selective epitaxy. An $SiO_2$ layer is formed to cover the substrate. Openings are then formed through the $SiO_2$ to expose the source/drain regions. Semiconductor material 12 is then epitaxially grown. Semiconductor material 12 is preferably formed using Molecular Beam Epitaxy (MBE), although other deposition techniques, including Chemical Vapor Deposition (CVD), Ultra High Vacuum Chemical Vapor Deposition (UHVCVD), Atomic Layer Chemical Vapor Deposition (ALCVD) or Metal Organic Chemical Vapor Deposition (MOCVD). Deposition preferably occurs at a temperature in the range of 300° C.-950° C., and more preferably in the range of 450° C. to 850° C., and at a pressure less than 100 mTorr. In the region where the single crystal substrate is exposed, semiconductor layer 12 is grown epitaxially. On the $SiO_2$ layer, poly-crystal is formed. The poly-crystal and $SiO_2$ are then etched, leaving only semiconductor layer 12. Semiconductor material 12 forms part of the source and drain regions for the resulting MOS transistor. Generally, it is desirable that the source and drain regions formed from semiconductor material 12 be highly doped (e.g., $>2\times10^{20}$ $cm^{-3}$).

Doping of semiconductor material 12 can be accomplished either during the epitaxial growth process or subsequently in an ion implantation step. In a preferred embodiment, doping of semiconductor material 12 occurs concurrently with the epitaxial growth step. This is accomplished by introducing appropriate dopants, such as boron, phosphorous, arsenic, and the like into the chamber along with other process gases, such as silicon, germanium, hydrogen, chlorine, nitrogen, helium, and the like, during the epitaxial growth step.

Semiconductor layer 12 has an energy bandgap lower than the underlying substrate 2, which is typically lower than 1.1 eV when the substrate is silicon. In a preferred embodiment, semiconductor layer 12 comprises a Si and Ge compound. Carbon can optionally be added to compensate for the lattice spacing difference between semiconductor layer 12 and substrate 2. In a preferred embodiment, the germanium content is more than 10%, and more preferably in the range of 10% to 50%. The carbon content is typically less than 4%, and preferably in the range of 0.1% to 2%.

In other embodiments, instead of being formed on the surface of substrate 2, semiconductor material 12 is recessed (partly or in whole) in substrate 2. A pair of recesses (not shown) is formed on either side of gate electrode 8 by etching substrate 2. Note that substrate 2 may be undercut beneath spacers 10, resulting in the recesses being aligned with gate electrode 8. Spacers 10 are designed so as to allow for precise alignment of the recesses with the gate electrodes. In other embodiments, spacers 10 may be designed so that the recessed regions are spaced apart (in the vertical alignment sense) from the gate electrode 8. In yet other embodiments, it may be desirable to have recesses formed within the vertical boundaries of gate electrode 8, such that the channel region resulting from the subsequently formed source and drain regions is shorter than the gate electrode width. One skilled in the art will recognize that the optimum alignment of the recesses can be derived through routine experimentation. In a preferred embodiment, wherein substrate 2 is a semiconductor wafer or a semiconductor layer on an underlying BOX insulator, recesses may be formed by anisotropically etching the substrate using, e.g., ion etching.

In other embodiments, semiconductor material 12 may have a layered structure and the top layer may cover all of the bottom layer or only part of the bottom layer. In this embodiment, the bandgap of the top layer, which is in direct contact with metal, is lower than the bandgap of substrate 2.

Figure 2D:
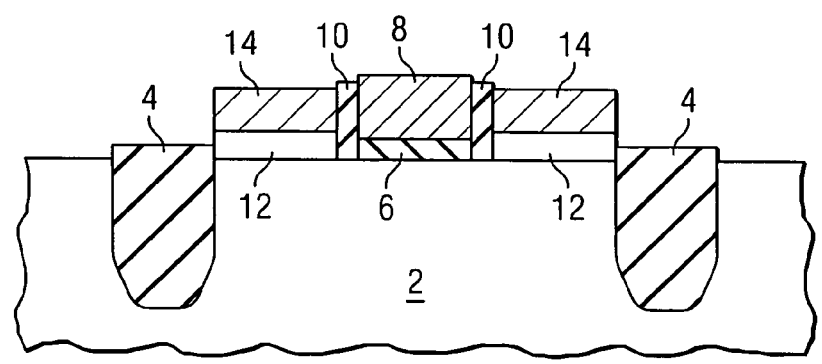

As illustrated in FIG. 2d, metal layer 14 is formed over source and drain regions and preferably over gate electrode 8 as well. The thickness of metal 14 is preferably less than about 500 Å. Metal 14 may be a transition metal or metal compound such as titanium, cobalt, tungsten, tantalum, or the like or other appropriate conductive material deposited via Chemical Vapor Deposition (CVD), Physical Vapor Deposition (PVD) or other alternatives. As discussed, a Schottky barrier formed between metal 14 and semiconductor material 12 has a lower barrier height than a barrier height that would be formed between direct contact of metal 14 and substrate 2. Layer 14 is referred to interchangeably as a metal layer or a silicide layer in the specification. It should be recognized that, depending upon the embodiment, layer 14 could be either a metal layer or a silicide formed from a metal layer that has interacted with the underlying semiconductor regions, or a combination thereof (e.g., a metal layer over a silicide layer).

In a preferred embodiment, metal 14 is a metal silicide. The metal silicide may contain N or C, and may contain between 1% and 25% Ge, preferably 1-5% Ge. The metal silicide may take the form of transition-metal silicide and may contain more than one transition metal. In a preferred embodiment, metal layer 14 is formed by first depositing a thin layer of metal, such as titanium, cobalt, nickel, tungsten, or the like, over the device, including the exposed surfaces of semiconductor layer 12 and gate electrode 8. The device is then annealed at a temperature higher than 300° C., and preferably between 400-800° C., and at a pressure lower than about 10 Torr, and more preferably lower than about 1 Torr to form a silicide between the deposited metal and the underlying exposed silicon regions (specifically source/drain regions and polysilicon gate conductor 8). The resulting metal silicide regions are illustrated as metal layer 14 in FIG. 2d. Preferably, the resulting silicide layer 14 is in the range of 300 Å to 500 Å thick, although the desired thickness is a matter of design choice. In yet another embodiment, silicide layer 14 could be formed by the deposition of a silicide, such as cobalt silicide or nickel silicide, directly onto the surface of source and drain regions and gate electrode 8 using known deposition techniques, such as CVD.

Figure 2E:
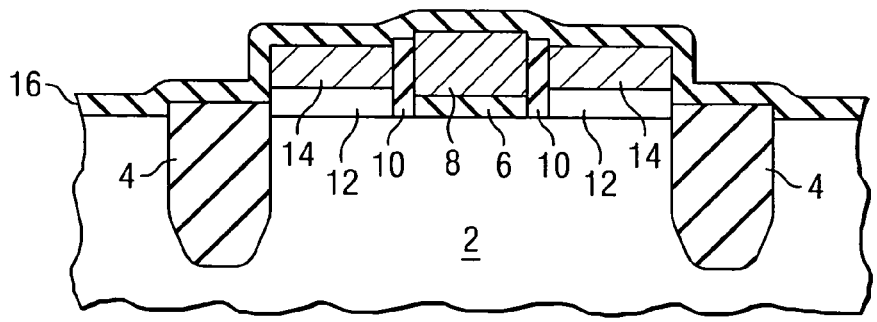

As illustrated in FIG. 2e, a dielectric layer 16 is next blanket deposited over the device. Dielectric layer 16 is preferably formed to a thickness of about 50 Å-1000 Å. Dielectric layer 16 may be formed using Low Pressure Chemical Vapor Deposition (LPCVD), but other CVD methods, such as Plasma Enhanced Chemical Vapor Deposition (PECVD), and thermal CVD may also be used. As discussed above, dielectric layer 16 is preferably chosen not only for its dielectric properties, but also for its ability to compensate for stress arising from the lattice mismatch between semiconductor material 12 and metal layer 14 and between semiconductor material 12 and underlying substrate 2. The lattice mismatch may cause performance degrading defects at the interfaces, which defects may propagate throughout the affected layers.

In the above preferred embodiments, in which source and drain regions of SiGeC are formed on a silicon substrate and a silicide layer is formed on the upper surface of the source and drain regions, the lattice mismatch between the layers may cause an overall stress (e.g., tensile or compressive) on the silicide layer, typically in the range of 400 Mpa-4 GPa.

Figure 3:
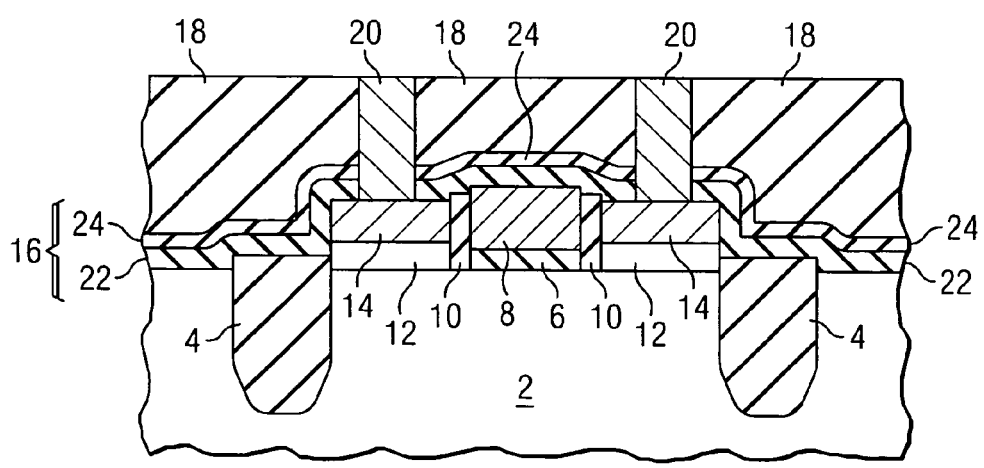
FIG. 3 is a cross-sectional view of a MOS transistor with a composite dielectric layer.

The material and deposition method of dielectric layer 16 may be chosen, at least in part, to compensate for this stress. In a preferred embodiment, dielectric layer 16 is formed of a composite oxide/oxynitride structure, in which a first oxide sub-layer of approximately 100 Å is first formed, followed by an oxynitride layer of approximately 300 Å. The oxide and oxynitride layer is preferably formed by PECVD at a temperature lower than 550° C. FIG. 3 illustrates a device employing an oxide/oxynitride composite dielectric layer 16, where material 24 is oxynitride and material 22 is oxide.

The above described dielectric layer will preferably provide for stress of approximately 400 MPa-4 GPa, preferably in the range of 400 MPa-2 GPa. One of ordinary skill in the art will recognize that a wide range of compressive and tensile stresses can be compensated for by adjusting the materials used for dielectric layer 16 and the method of deposition. For instance, silicon nitride deposited by Low Pressure Chemical Vapor Deposition (LPCVD) may be used to provide for tensile film stress. Likewise, silicon nitride deposited by PECVD may be used to provide for compressive film stress.

Figure 2F:
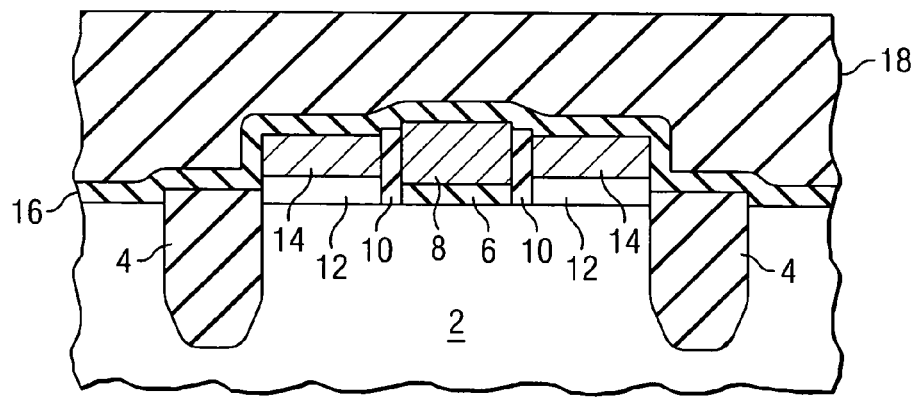
Figure 2G:
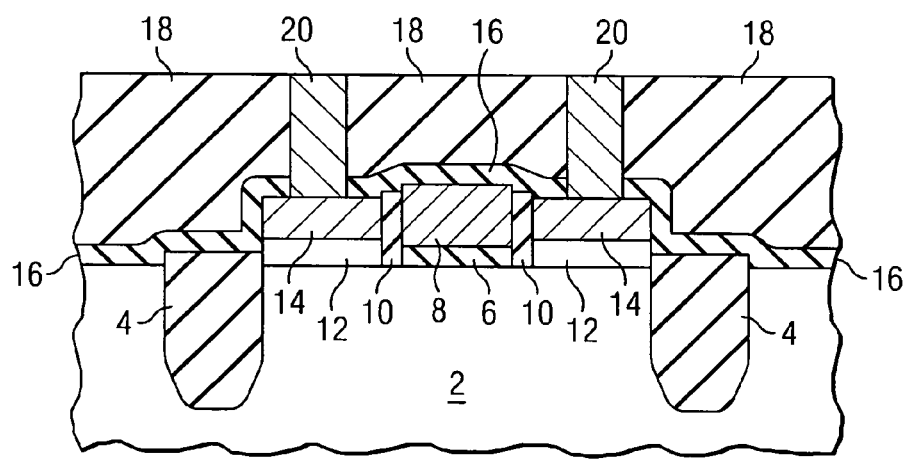

As illustrated in FIG. 2f, an inter-level dielectric (ILD) layer, also sometimes known as a pre-metal dielectric (PMD) or an inter-metal dielectric (IMD) layer, is next deposited over the surface of the dielectric layer 16. This ILD layer 18 is preferably silicon dioxide deposited using, e.g., Tetraethyl orthosilicate (TEOS), CVD, PECVD, LPCVD, or other well-known deposition techniques. This ILD layer 18 provides insulation between the transistor and overlying metal lines. A photoresist material (not shown) may be formed and patterned over the ILD layer 18 in order to form contact openings to the source and drain regions and the gate dielectric. FIG. 2g illustrates the device after the exposed portions of ILD dielectric layer 18 have been etched away, thus opening contact openings in the ILD dielectric layer. Note that dielectric layer 16 operates as an etch stop layer during the etching of ILD dielectric layer 18 and thus protects the underlying silicide layer 14. Next, the exposed portions of dielectric layer 16 in the contact openings are etched, preferably using Reactive Ion Etching (RIE). Because dielectric layer 16 is quite thin relative to ILD dielectric layer 18, process control and endpoint detection are more closely controlled, thus limiting the likelihood of over-etching through the underlying silicide layer 14.

FIG. 2g illustrates the device after metal plugs 20 have been formed in the contact openings. Metal plugs 20 may be formed of tungsten, aluminum, copper, or other well known alternatives. Metal plugs 20 may also be composite structures, including, e.g., barrier and adhesion layers, such as titanium/titanium nitride or tantalum nitride, and other layers as well. By providing a novel structure in which metal plugs 20 contact a silicide layer 14, which contacts the underlying low bandgap energy material 12, coupled with stress-compensating dielectric layer 16, the contact resistance and stress-induced defects may be reduced, thus improving device performance.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device comprising:
    a substrate formed of a first kind of semiconductor having a first energy bandgap;
    a gate dielectric on said substrate;
    a gate electrode on said gate dielectric;
    source and drain regions on the substrate and on opposite sides of the gate dielectric, the source and drain regions having at least a top portion formed of a second kind of semiconductor with a second energy bandgap, wherein the second energy bandgap is lower than the first energy bandgap;
    a metal on the top portion of at least one of the source and drain regions;
    a first dielectric layer comprising a source portion over said source region and a drain portion over said drain region on the metal, wherein said source portion and said drain portion of said first dielectric layer are interconnected through a portion of the first dielectric layer over said gate electrode;
    a second dielectric layer on the first dielectric layer, wherein in the second dielectric layer comprises a source portion over said source region and a drain portion over said drain region, and wherein said source portion and said drain portion of said second dielectric layer are interconnected through a portion of the second dielectric layer over said gate electrode, and wherein the first and the second dielectric layers compensate for stresses in said source and drain regions arising from a lattice mismatch between said top portion and said metal layer;
    an inter-level (ILD) over the second dielectric layer; and
    a conductive plug contacting the metal and disposed in said first and second dielectric layers.

2. The device of claim 1 wherein said first dielectric layer has inherent compressive stress.

3. The device of claim 1 wherein said first dielectric layer has inherent tensile stress.

4. The device of claim 1 wherein said first dielectric layer comprises a material selected from the group consisting of silicon nitride, silicon oxynitride, and combinations thereof.

5. The device of claim 1 wherein said top portion of said source and drain regions extends throughout said source and drain regions.

6. The device of claim 1 wherein said top portion of said source and drain regions has a thickness of more than about 50Å.

7. The device of claim 1 wherein said top portion of said source and drain regions contains at least about 10 atomic percent Ge.

8. The device of claim 1 wherein said top portion of said source and drain regions contains up to about 4 atomic percent C.

9. The device of claim 1 wherein said metal is a metal compound.

10. The device of claim 9 wherein said metal compound is a metal silicide.

11. The device of claim 10 wherein said metal silicide comprises at least two materials selected from the group consisting of N, C and combinations thereof.

12. The device of claim 10 wherein said metal silicide contains between about 1 and about 25 atomic percent Ge.

13. The device of claim 10 wherein said metal silicide comprises N.

14. The device of claim 9 wherein said metal compound comprises two or more transition metals.

15. The device of claim 1 wherein said first dielectric layer comprises at least two materials selected from the group consisting of Si, O, N and combinations thereof.

16. The device of claim 1 wherein said first dielectric layer has a thickness between about 50 Å to about 1000 Å.

17. The device of claim 1 wherein said gate electrode comprises a second semiconductor on said gate dielectric and a second metal on said second semiconductor, and wherein an energy bandgap of said second semiconductor is lower than an energy bandgap of said first semiconductor.

18. The device of claim 17 wherein said second semiconductor contains between about 10 and about 50 atomic percent Ge.

19. The device of claim 1 wherein said source and drain regions are recessed within said substrate.

* * * * *

UNITED STATES PATENT AND TRADEMARK OFFICE
CERTIFICATE OF CORRECTION

PATENT NO. : 7,453,133 B2  Page 1 of 1
APPLICATION NO. : 10/880992
DATED : November 18, 2008
INVENTOR(S) : Lee et al.

It is certified that error appears in the above-identified patent and that said Letters Patent is hereby corrected as shown below:

On the Title Page, Item (56) References Cited, OTHER PUBLICATIONS, 2$^{nd}$ entry, delete "Öztörk" and insert --Öztürk--.
In Col. 8, line 29, before the delete "in".

Signed and Sealed this

Sixth Day of January, 2009

JON W. DUDAS
*Director of the United States Patent and Trademark Office*